(12) United States Patent
Takase et al.

(10) Patent No.: US 7,371,299 B2
(45) Date of Patent: May 13, 2008

(54) SET OF RESIN SHEETS AND METHOD FOR PRODUCING CERAMIC STRUCTURE USING THE SAME, AND CERAMIC STRUCTURE

(75) Inventors: Hiroyuki Takase, Osaka (JP); Shinichi Suzuki, Osaka (JP); Yuuji Tanaka, Osaka (JP)

(73) Assignee: Kyocera Corporation, Kyoto (JP)

( * ) Notice: Subject to any disclaimer, the term of this patent is extended or adjusted under 35 U.S.C. 154(b) by 419 days.

(21) Appl. No.: 11/140,594

(22) Filed: May 26, 2005

(65) Prior Publication Data

US 2005/0263238 A1 Dec. 1, 2005

(30) Foreign Application Priority Data

May 27, 2004 (JP) .......................... P2004-158459

(51) Int. Cl.
*C03B 29/00* (2006.01)
*H01L 23/02* (2006.01)
(52) U.S. Cl. ................. 156/89.11; 156/89.12; 156/89.23; 264/610
(58) Field of Classification Search ............ 156/89.11, 156/89.12, 89.23; 264/610
See application file for complete search history.

(56) References Cited

U.S. PATENT DOCUMENTS

| | | | |
|---|---|---|---|
| 5,239,744 A * | 8/1993 | Fleming et al. ............ 29/602.1 |
| 5,601,673 A * | 2/1997 | Alexander ................ 156/89.12 |
| 5,779,833 A * | 7/1998 | Cawley et al. ............ 156/89.11 |
| 7,018,494 B2 * | 3/2006 | Suzuki et al. ............. 156/89.11 |
| 2003/0192636 A1 | 10/2003 | Smith et al. |
| 2004/0099364 A1 * | 5/2004 | Suzuki et al. ............. 156/89.11 |

FOREIGN PATENT DOCUMENTS

| | | | |
|---|---|---|---|
| JP | 01-283140 | * | 11/1989 |
| JP | 03-012952 | * | 1/1991 |
| JP | 2003-318541 | | 11/2003 |
| JP | 2003-332741 | | 11/2003 |
| JP | 2004-106540 | * | 4/2004 |
| JP | 2004-323306 | * | 11/2004 |
| JP | 2005-131971 | * | 5/2005 |

* cited by examiner

*Primary Examiner*—Melvin Mayes
(74) *Attorney, Agent, or Firm*—Hogan & Hartson LLP

(57) ABSTRACT

A set of resin sheets includes a plurality of resin sheets. Each resin sheet is disposed in a site to be a surface recess or inner void in a ceramic green sheet to be laminated, and a plurality of such ceramic green sheets each with the resin sheet disposed therein are laminated and fired, whereupon the resin sheets are removed by thermal decomposition during the firing. In the set of resin sheets, the relation of $T_a < T_b \leq T_c$ is satisfied wherein $T_a$ (° C.) indicates an 80% weight reduction temperature of an uppermost resin sheet, $T_b$ (° C.) indicates an 80% weight reduction temperature of a lowermost resin sheet, and $T_c$ (° C.) indicates a 20% weight reduction temperature of a resin binder which is contained in the ceramic green sheets in which the green sheets are disposed.

5 Claims, 4 Drawing Sheets

SET OF RESIN SHEETS AND METHOD FOR PRODUCING CERAMIC STRUCTURE USING THE SAME, AND CERAMIC STRUCTURE

BACKGROUND OF THE INVENTION

1. Field of the Invention

The present invention relates to a set of resin sheets, and to a method for producing a ceramic structure using the set of resin sheets by laminating, integrating and firing a plurality of ceramic green sheets. Precisely, the invention relates to a ceramic structure having a surface recess or inner void in the surface thereof and a ceramic structure having an inner void thereinside, and to a method for producing the same.

2. Description of the Related Art

Heretofore, ceramic structures having a surface recess in a surface thereof have been applied to, for example, electronic parts-casing packages for casing semiconductor devices such as LSI or other various electronic parts therein, and demand for a ceramic structure having a complicated profile with an inner void therein is now increasing.

A ceramic structure of this type is such constituted, for example, when they are for electronic parts-casing packages, a metallized wiring layer is disposed on or inside an insulator that comprises laminated multiple insulating layers. Ceramics such as alumina ceramics are much used for the insulating layer, and recently, an insulator formed by laminating insulating layers has been put into practical use, in which the insulating layer is made of a sintered glass ceramic body that enables simultaneous firing with copper metallized wiring.

The ceramic structure of the type may be produced as follows: a suitable resin binder is added to a ceramic mix powder prepared by mixing the necessary components in a predetermined ratio, then the resulting mix powder is dispersed in an organic solvent to prepare a slurry, and this is formed into a ceramic green sheet (this may be hereinafter referred to as a green sheet) having a predetermined thickness according to a casting process such as a well-known doctor blade process or lip coater process.

Next, a metallized wiring layer is formed on the green sheet. Briefly, a suitable metal powder is mixed with a resin binder, a solvent and a solubilizer to prepare a metal paste, and this is printed on the green sheet to form a predetermined pattern therein according to a well-known screen-printing process. Through-holes are formed in the printed green sheet by the use of a microdrill or a laser, and the through-holes are filled with the metal paste to be through-conductors (via-conductors, via-holes).

The subsequent step is described for two cases, (1) one is a ceramic structure having a surface recess in the surface thereof; and (2) the other is a ceramic structure having an inner void thereinside.

In case (1), a through-hole is punched in a predetermined site of a green sheet for the purpose of forming a surface recess in the surface thereof. Next, as in FIG. 3A of FIGS. 3A and 3B showing conventional processes, a plurality of green sheets 21a and 21b each with the through-hole 20 formed therein are laminated with other green sheets 21c, 21d and 21e by the use of a suitable adhesive liquid, and the resulting green sheet laminate having a surface recess 22 formed in its surface is fired under a predetermined condition to obtain a ceramic structure 23 of FIG. 3B.

In case (2), a green sheet is laminated on a ceramic green sheet with the through-hole constituting the inner void by the use of a suitable adhesive liquid, and the resulting green sheet laminate is fired under a predetermined condition to give a ceramic structure having a void thereinside.

These days ceramic structures of the type are desired to be downsized with the recent tendency in the art toward multi-function and high-function devices, and it is indispensable to prevent the green sheets therefor from being deformed when laminated. Further, it is also desired to provide more complicated ceramic structures having multiplesurface recesses or inner voids. As a related art, there are Japanese Unexamined Patent Publication JP-A 2003-318541 and Japanese Unexamined Patent Publication JP-A 2003-332741.

However, when a green sheet with a through-hole to form a surface recess or inner void is laminated under pressure with a green sheet with no through-hole to produce a ceramic structure having a surface recess or inner void, there occurs a pressure difference between the surface recess or inner void part and the other part and, as a result, the bottom of the surface recess or inner void of the green sheet laminate not receiving pressure may swell. When an electronic part is fitted to the bottom of the swollen surface recess or inner void, then there may occur bonding failures.

When the pressure to be given for the bonding is lowered so as to solve the problem, then the pressure necessary for the bonding of the peripheral parts around the surface recess or inner void lowers and, as a result, the green sheets may delaminate. In that condition, it is difficult to obtain a ceramic structure of high reliability with no structure defects.

On the other hand, when the wall that surrounds the surface recess or inner void of a green sheet is thin and weak, then there may occur a problem in that the thin wall part will be deformed under pressure in lamination; or when multiple surface recesses or inner voids spaced from each other with a narrow distance therebetween are formed in one green sheet by punching the green sheet or when one green sheet with multiple surface recesses or inner voids formed therein is snapped into individual pieces for ceramic structures by the use of a cutting edge of metal or the like in a process of green sheet working, then there may also occur a problem in that the thin wall part around the surface recesses or inner voids will be deformed.

For solving the problems, a method may be taken into consideration, which comprises filling a resin sheet capable of being removed through thermal decomposition in firing, in the site to form a surface recess or inner void in a green sheet laminate and laminating the thus-filled green sheets.

However, at the step of thermal decomposition of the resin sheet in firing, the melted substance of the resin sheet dissolves the resin binder in the green sheet that is in contact with the resin sheet, and therefore there occurs a problem in that the green sheet is thereby deformed.

In addition, when the resin binder in a green sheet that is in contact with a resin sheet is thermally decomposed (removed) and while the amount of the resin binder in the green sheet decreases, then the strength of the green sheet lowers. In such a case, when the resin sheet is thereafter thermally decomposed on the brittle green sheet, then the resin sheet melt of high viscosity that has become liquid under heat is further thermally decomposed on the surface of the green sheet that has become brittle after resin sheet removal, while boiling, vibrating and moving on every side. As a result, there occurs a still another problem in that the surface of the green sheet that is in contact with the thermally decomposed part is partly hollowed out and the surface thereof is therefore eroded and broken.

These problems are especially remarkable when the amount of the resin sheet to be fitted to a green sheet is large. Specifically, at the step of binder removal, the entire resin sheet is simultaneously thermally decomposed and therefore a large amount of a melted matter is formed all at a time. In addition, the vapor resulting from the vaporization of the melted matter is formed also all at a time, and it may be believed that the damage of the green sheet that is in contact with the resin sheet is will be great.

SUMMARY OF THE INVENTION

Hence, the invention has been completed in consideration of the problems noted above, and its object is to provide a set of resin sheets suitable for preventing the deformation and the delamination in the site around a surface recess or inner void of a ceramic structure, to provide a method for producing a ceramic structure using the set of resin sheets, and to provide a ceramic structure.

The invention provides a set of resin sheets for use in producing a ceramic structure having at least either a surface recess or inner void formed by laminating and firing a plurality of ceramic green sheets, the set of resin sheets comprising:

a plurality of resin sheets, each of the resin sheets being disposed in a site to be a surface recess or inner void in a ceramic green sheet, the resin sheet being removed by thermal decomposition in laminating and firing the plurality of ceramic green sheets each with the resin sheet disposed therein, wherein the a relation of $T_a < T_b \leq T_c$ is satisfied wherein $T_a$ (° C.) indicates an 80% weight reduction temperature of an uppermost resin sheet, $T_b$ (° C.) indicates an 80% weight reduction temperature of a lowermost resin sheet, and $T_c$ (° C.) indicates a 20% weight reduction temperature of a resin binder which is contained in the ceramic green sheets in which the resin sheets are disposed.

Further, in the invention, it is preferable that the resin sheet undergoes 99 wt. % or more thermal decomposition at 600° C.

Furthermore, in the invention, it is preferable that the resin sheet contains resin beads, a resin binder, and at least either a plasticizer or a lubricant.

The invention provides a method for producing a ceramic structure having at least either a surface recess or inner void therein formed by laminating and firing a plurality of ceramic green sheets, the method comprising:

a step of disposing a resin sheet in a site to be a surface recess or inner void in ceramic green sheets to be laminated;

a step of laminating the plurality of ceramic green sheets each with the resin sheet disposed therein; and a step of removing the resin sheets by thermal decomposition in firing the resulting ceramic green sheet laminate, wherein a relation of $T_a < T_b \leq T_c$ is satisfied wherein $T_a$ (° C.) indicates an 80% weight reduction temperature of the uppermost resin sheet, $T_b$ (° C.) indicates an 80% weight reduction temperature of the lowermost resin sheet, and $T_c$ (° C.) indicates a 20% weight reduction temperature of a resin binder which is contained in the ceramic green sheets in which the resin sheets are disposed.

Furthermore, in the invention it is preferable that the step of removing the resin sheet by thermal decomposition in firing the ceramic green sheet laminate includes a first binder removal step of removing the uppermost resin sheet by thermal decomposition by keeping the temperature $T_a$° C. for a predetermined period of time and a second binder removal step of removing the lowermost resin sheet by thermal decomposition by keeping the temperature $T_b$° C. for a predetermined period of time.

The invention provides a method for producing a ceramic structure having an inner void therein formed by laminating and firing a plurality of ceramic green sheets, comprising:

a step of disposing a resin sheet in a site to be an inner void in the ceramic green sheet; and a step of laminating the plurality of ceramic green sheets to form a laminate of the ceramic green sheets each having a recess filled with the resin sheet, wherein a relation of $T_a < T_b \leq T_c$ is satisfied wherein $T_a$ (° C.) indicates an 80% weight reduction temperature of the uppermost resin sheet, $T_b$ (° C.) indicates an 80% weight reduction temperature of the lowermost resin sheet, and $T_c$ (° C.) indicates a 20% weight reduction temperature of a resin binder which is contained in the ceramic green sheets in which the resin sheets are disposed, the method further comprising:

a first binder removal step of removing the uppermost resin sheet by thermal decomposition by keeping the temperature $T_a$° C. for a predetermined period of time followed by cooling the resulting green sheet to room temperature;

a step of further laminating another such ceramic green sheet on the laminate so as to cover the recess filled with the resin sheet to thereby form a laminate having an inner void thereinside; and a second binder removal step of removing the lowermost resin sheet by thermal decomposition by keeping the temperature $T_b$° C. for a predetermined period of time.

Furthermore, in the invention it is preferable that the step of removing the resin sheet in firing the ceramic green sheet laminate includes a third binder removal step of keeping the green sheet laminate at a temperature higher than $T_c$ (° C.) for a predetermined period of time.

Furthermore, in the invention it is preferable that the method further comprises a third binder removal step of keeping the green sheet laminate at a temperature higher than $T_c$ (° C.) for a predetermined period of time.

The invention provides a ceramic structure which is produced by the method for producing a ceramic structure mentioned above, the ceramic structure having at least either a surface recess or inner void therein.

According to the invention, the set of resin sheets is used in producing a ceramic structure having at least either a surface recess or inner void by laminating and firing a plurality of ceramic green sheets. The resin sheet is disposed in the site to be a surface recess or inner void in a ceramic green sheet, a plurality of such ceramic green sheets each with the resin sheet disposed therein are laminated and fired, whereupon the resin sheet is removed by thermal decomposition during the firing. The resin sheet is characterized in that a relation of $T_a < T_b \leq T_c$ is satisfied wherein $T_a$ (° C.) indicates an 80% weight reduction temperature of the uppermost resin sheet, $T_b$ (° C.) indicates an 80% weight reduction temperature of the lowermost resin sheet, and $T_c$ (° C.) indicates a 20% weight reduction temperature of the resin binder which is contained in the ceramic green sheets in which the resin sheets are disposed. Therefore, the uppermost resin sheet is first thermally decomposed and then the lowermost resin sheet is thermally decomposed later. This means that the resin sheet is stepwise and gradually thermally decomposed from the uppermost resin sheet under a mild condition. Specifically, in this mode, the resin sheet is prevented from being entirely thermally decomposed all at a time to give a large amount of a melted matter all at a time, and therefore it is possible to prevent generation of a large amount of vaporized gas all at a time from the melted matter.

Accordingly, the invention solves the problem with a ceramic structure where the site around a surface recess or inner void is deformed.

Further, according to the invention, the resin sheet undergoes at least 99 wt. % thermal decomposition at 600° C. During firing, therefore, a thermally decomposed residue (carbon) of the resin sheet is more effectively prevented from remaining in the contact face between the ceramic structure and the resin sheet.

Furthermore, since the resin sheet contains resin beads, a resin binder, and at least either a plasticizer or a lubricant, during shearing such as punching or cutting of the resin sheet, cracks are readily formed in the shearing direction via the resin layer existing between the resin beads, and the shearing operation is easy. In addition, since the cracks formed in the direction except the shearing direction are prevented from propagating further owing to the existence of the resin beads, the crack propagation in the direction except the shearing direction can be prevented and the resin sheet can be sheared in any desired form. Therefore, a resin sheet having almost the same form as that of a through-hole can be fitted into the through-hole, and the green sheets laminated under pressure can be prevented from being deformed. Further, since the resin sheet contains at least either a plasticizer or a lubricant, its workability may be further improved. The resin sheet containing a plasticizer may be softer and more flexible. The resin sheet containing a lubricant is more readily sheared since the resin-to-resin or beads-to-beads lubrication is better during shearing of the resin sheet. Accordingly, the shearing workability can be improved and the resin sheet is prevented from belong elongated during the shearing, thereby the working with high dimensional accuracy can be realized.

According to the invention, the method for producing a ceramic structure comprises laminating and firing a plurality of ceramic green sheets to give a ceramic structure having at least either a surface recess or inner void. Specifically, the method includes a step of disposing a resin sheet in the site to be a surface recess or inner void in a ceramic green sheet to be laminated, a step of laminating a plurality of such ceramic green sheets each with the resin sheet disposed therein, and a step of removing the resin sheet in firing the resulting ceramic green sheet laminate, and in the method a relation of $T_a<T_b\leq T_c$ is satisfied wherein $T_a$ (° C.) indicates an 80% weight reduction temperature of the uppermost resin sheet, $T_b$ (° C.) indicates an 80% weight reduction temperature of the lowermost resin sheet, and $T_c$ (° C.) indicates a 20% weight reduction temperature of the resin binder which is contained in the ceramic green sheets in which the resin sheets are disposed. In the method, therefore, uniform pressure lamination is possible to produce a ceramic structure with no deformation of the surface recess or inner void and with no trouble of delamination.

In the method, in addition, the uppermost resin sheet is first thermally decomposed and removed and then the lowermost resin sheet that is to be in contact with a green sheet is thermally decomposed later. Therefore, in the method, the resin sheet can be stepwise and gradually thermally decomposed under such a mild condition. As a result, the opportunity of contact between a resin sheet melt and the green sheet just below can be minimized, and the green sheet is prevented-from being damaged.

Further, after the resin sheet is removed by thermal decomposition, the resin binder contained in the green sheet is then thermally decomposed later. Accordingly, in the stage where the resin sheet is thermally decomposed and its melt exists, the resin binder exists sufficiently in the green sheet and therefore the green sheet is not brittle. Therefore, since the strength of the green sheet is kept relatively good in that stage, and the problem of deforming the site to form a surface recess or inner void as well as the problem of cutting a conductor formed in the surface recess or inner void can be prevented.

Further, in the method for producing a ceramic structure, the step of removing the resin sheet in firing the ceramic green sheet laminate includes a first binder removal step of removing the uppermost resin sheet by thermal decomposition by keeping the temperature $T_a°$ C. for a predetermined period of time and a second binder removal step of removing the lowermost resin sheet by thermal decomposition by keeping the temperature $T_b°$ C. for a predetermined period of time. Therefore in the preferred embodiment, the uppermost resin sheet may be first removed by thermal decomposition and then the lowermost resin sheet may be well and removed by thermal decomposition later.

Furthermore, the method for producing a ceramic structure is a method for producing a ceramic structure having an inner void therein bylaminating and firing a plurality of ceramic green sheets. The method for producing a ceramic structure includes a step of disposing a resin sheet in the site to be an inner void in the ceramic green sheet, a step of laminating a plurality of ceramic green sheets to form a laminate of the ceramic green sheets each having a recess filled with the resin sheet. In the method for producing a ceramic structure, a relation of $T_a<T_b\leq T_c$ is satisfied wherein $T_a$ (° C.) indicates an 80% weight reduction temperature of the uppermost resin sheet, $T_b$ (° C.) indicates an 80% weight reduction temperature of the lowermost resin sheet, and $T_c$ (° C.) indicates a 20% weight reduction temperature of the resin binder which is contained in the ceramic green sheets in which the resin sheets are disposed . The method for producing a ceramic structure further includes a first binder removal step of removing the uppermost resin sheet by thermal decomposition by keeping the temperature $T_a°$ C. for a predetermined period of time followed by cooling the resulting green sheet to room temperature, a step of further laminating another such ceramic green sheet on the laminate so as to cover the recess filled with the resin sheet to thereby form a laminate having an inner void thereinside, and a second binder removal step of removing the lowermost resin sheet by thermal decomposition by keeping the temperature $T_b°$ C. for a predetermined period of time. Therefore in the preferred embodiment, uniform pressure lamination is possible to produce a ceramic structure having an inner void with no deformation of the inner void therein and with no trouble of delamination. In addition, since the amount of the decomposition gas to be generated during the thermal decomposition of the lowermost resin sheet can be minimized, this embodiment solves the problem of inner void deformation in the ceramic structure.

Furthermore, according to the invention, the step of removing the resin sheet by thermal decomposition in firing the ceramic green sheet laminate includes a third binder removal step of keeping the green sheet laminate at a temperature higher than $T_c$ (° C.) for a predetermined period of time. In this preferred embodiment, therefore, the resin binder in the ceramic green sheet can be fully thermally decomposed, and also the ceramic green sheet is prevented from being deformed and a precision ceramic structure can be constructed.

BRIEF DESCRIPTION OF THE DRAWINGS

Other and further objects, features, and advantages of the invention will be more explicit from the following detailed description taken with reference to the drawings wherein.

DETAILED DESCRIPTION

Figure 1A:
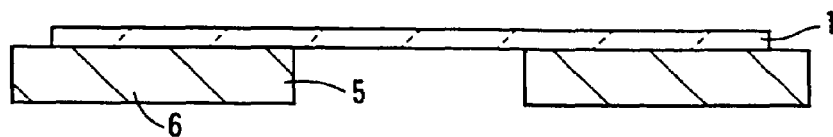
FIGS. 1A to 1F are views for explaining processes of producing a green sheet with a resin sheet fitted thereto, which is to give a ceramic structure of the invention.
Figure 1B:
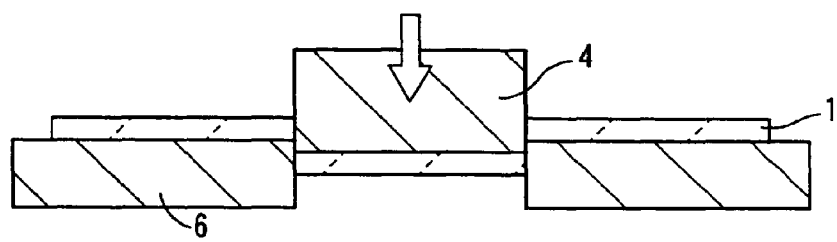
Figure 1C:
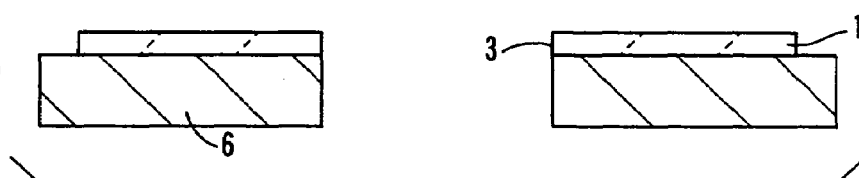

Now referring to the drawings, preferred embodiments of the invention are described below.

A set of resin sheets, a method for producing a ceramic structure using the same, and a ceramic structure of the invention are described in detail hereinunder.

A green sheet to give a ceramic structure is formed as follows. A mixture prepared by mixing a raw material powder of a green sheet, for example at least one of ceramic powder and glass powder optionally along with a ceramic powder that serves as a sintering promoter is further mixed with additive such as resin binder and plasticizer, and organic solvent to prepare a slurry. Next, the slurry is formed into a green sheet having a predetermined thickness according to a sheet-forming process such as a-doctor blade process, a rolling process or a pressing process.

Next, when an electric wiring is formed, the green sheet is punched to form a through-hole that is to be a via hole to connect upper and lower wiring conductor layers, and the through-hole is filled with a conductor paste.

The ceramic powder may be a metal or non-metal oxide or non-oxide powder. The powder may have a single composition or a compound composition, and those having a single or compound composition may be used herein either singly or as combined. Concretely, herein usable are oxides, carbides, nitrides, borides and sulfides of Li, K, Mg, B, Al, Si, Cu, Ca, Br, Ba, Zn, Cd, Ga, In, lanthanoids, actinoids, Ti, Zr, Hf. Bi, V, Nb, Ta, W, Mn, Fe, Co, Ni.

More concretely, herein usable are composite oxides of $SiO_2$, $Al_2O_3$, $ZrO_2$, $TiO_2$ with alkaline earth metal oxides; ZnO, MgO, $MgAl_2O_4$, $ZnAl_2O_4$, $MgSiO_3$, $Mg_2SiO_4$, $Zn_2SiO_4$, $Zn_2TiO_4$, $SrTiO_3$, $CaTiO_3$, $MgTiO_3$, $BaTiO_3$, $CaMgSi_2O_6$, $SrAl_2Si_2O_8$, $BaAl_2Si_2O_8$, $CaAl_2Si_2O_8$, $Mg_2Al_4Si_5O_{18}$, $Zn_2Al_4Si_5O_{18}$ AlN, $Si_3N_4$, SiC; as well as composite oxides containing at least one selected from $Al_2O_3$ and $SiO_2$ (e.g., spinel, mullite, cordierite). These may be suitably selected and according to the use thereof.

For the glass powder, for example, preferred are $SiO_2$-$B_2O_3$ glass, $SiO_2$-$B_2O_3$-$Al_2O_3$ glass, $SiO_2$-$B_2O_3$-$Al_2O_3$-MO glass (where M indicates Ca, Sr, Mg, Ba or Zn), $SiO_2$-$Al_2O_3$-$M_1O$-$M_2O$ glass (where $M_1$ and $M_2$ are the same or different, each indicating Ca, Sr, Mg, Ba or Zn), $SiO_2$-$B_2O_3$-$Al_2O_3$-$M_1O$-$M_2O$ glass (where $M_1$ and $M_2$ have the same meanings as above), $SiO_2$-$B_2O_3$-$M_3O$ glass (where $M_3$ indicates Li, Na or K), $SiO_2$-$B_2O_3$-$Al_2O_3$-$M_3O$ glass (where $M_3$ has the same meaning as above), Pb-based glass, Si-based glass, and glass containing at least one selected from a group consisting of alkali metal oxides, alkaline earth metal oxides and rare earth oxides. When fired, glass of these types may be amorphous glass, or may be crystalline glass that deposit at least one crystal type of lithium silicate, quartz, cristobalite, cordierite, mullite, anorthite, celsian, spinel, Gahnite, willemite, dolomite, petalite and their substituted derivatives.

The blend ratio of ceramic powder and glass powder may be any one generally used in ordinary glass ceramic structure materials, but preferably from 60/40 to 1/99 by weight.

The assistant component includes $B_2O_3$, ZnO, $MnO_2$, alkali metal oxides, alkaline earth metal oxides and rare earth metal oxides, which may be selected in accordance with the use thereof.

When the ceramic structure of the invention is used for piezoelectric devices, its materials may be perovskite-structure crystals such as barium titanate and lead zirconate-lead titanate solid solutions. Concretely, they include zirconate titanates such as lead zirconate titanate (PZT) and lead lanthanum zirconate titanate (PLZT), and lead titanate.

Not specifically defined, the resin binder for the green sheet includes, for example, acrylic homopolymers and copolymers (homopolymers and copolymers of acrylic acid, methacrylic acid or their esters, concretely acrylic acid ester copolymers, methacrylic acid ester copolymers and copolymers of acrylic acid ester and methacrylic acid ester), and polyvinyl acetal-type, cellulose-type, polyvinyl alcohol-type, polyvinyl acetate-type, polyvinyl chloride-type and polypropylene carbonate-type homopolymers and copolymers. The binder resin contains at least-one selected from those homopolymers and copolymers. Specific examples of acrylic monomers are methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, tert-butyl acrylate, tert-butyl methacrylate, cyclohexyl acrylate, cyclohexyl methacrylate, 2-ethylhexyl acrylate, 2-ethylhexyl methacrylate, isononyl acrylate, isononyl methacrylate, isodecyl acrylate, isodecyl methacrylate. The copolymers comprising any of those acrylic acid esters and alkyl methacrylic acid esters as the backbone chain thereof may contain a comonomer that has a carboxylic acid group, an alkylene oxide group, a hydroxyl group, a glycidyl group, an amino group or an amido group, and these are preferably used in the invention.

The carboxylic acid group-having comonomer includes, for example, acrylic acid, methacrylic acid, maleic acid, itaconic acid, and fumaric acid. The alkylene oxide-having comonomer includes methylene oxide, ethylene oxide, and propylene oxide. The hydroxyl group-having comonomer includes 2-hydroxyethyl acrylate, 2-hydroxyethyl methacrylate, 2-hydroxybutyl acrylate, 2-hydroxybutyl methacrylate, diethylene glycol monoacrylate, diethylene glycol monomethacrylate, glycerin monoacrylate, glycerin monomethacrylate. The glycidyl group-having comonomer includes glycidyl acrylate, glycidyl methacrylate. The amino or amido group-having comonomer includes dimethylaminoethyl acrylate, dimethylaminoethyl methacrylate, diethylaminoethyl acrylate, diethylaminoethyl methacrylate, N-tert-butylaminoethyl acrylate, N-tert-butylaminoethyl methacrylate, acrylamide, cyclohexylacrylamide, cyclohexylmethacrylamide, N-methylolacrylamide, diacetonacrylamide.

The copolymers comprising any of those acrylic acid esters and alkyl methacrylic acid esters as the backbone chain thereof may be copolymerized with any other copolymerizable acrylonitrile, styrene, ethylene, vinyl, acetate, n-vinylpyrrolidone or the like.

Specific examples of the polyvinyl acetal-type polymers are polyvinyl butyral, polyvinyl ethylal, polyvinyl propylal, polyvinyl octylal, polyvinyl phenylal, and their derivatives.

Specific examples of the cellulose-type polymers are methyl cellulose, ethyl cellulose, carboxymethyl cellulose, bydroxypropyl cellulose, hydroxypropylmethyl cellulose, nitrocellulose, cellulose acetate.

Also not specifically defined, the conductor paste for forming conductive parts such as metallized wirings and via conductors may contain one or more different types of metal powders of, for example, Au, Cu, Ag, Pd, W, Mo, Ni, Al and Pt. When the conductor paste contains two or more different types of such metal powders, they may be mixed or alloyed. Preferably, the metal powders are mixed with resin binder, solvent, plasticizer and dispersant.

The resin binder for the conductor paste is not specifically defined. For example, the resin binder includes acrylic, polyvinyl acetal-type or cellulose-type homopolymers or copolymers. The resin binder contains at least one selected from those polymers.

Specific examples of the acrylic polymers are homopolymers and copolymers of acrylic acid, methacrylic acid or their esters. Concretely, they are acrylic acid ester copolymers, methacrylic acid ester copolymers, and copolymers of acrylic acid ester and methacrylic acid ester. These copolymers may contain any of a hydroxyl group, a carboxylic acid group, an alkylene oxide group, a glycidyl group, an amino group and an amido group suitably introduced thereinto. Introduced into the polymers, the group is expected to be effective for further improving the dispersibility of the polymers in ceramics and improving the viscosity and the thixotropic property of the paste. Not detracting from the properties of the polymers, such as the thermal decomposability and the solubility in various solvents thereof, any other comonomer copolymerizable with acrylic resin, such as styrene, α-methylstyrene, acrylonitrile, ethylene, vinyl acetate, polyvinyl alcohol or n-vinylpyrrolidone may be introduced into the polymers. One or more such acrylic resins may be suitably selected and used herein either singly or as combined.

The solvent for the conductor paste is not specifically defined, for which, for example, preferred are high-boiling-point solvents such as terpineol, dihydroterpineol, ethylcarbitol, butylcarbitol, carbitol acetate, butylcarbitol acetate, diisopropyl ketone, methyl cellosolve acetate, cellosolve acetate, butyl cellosolve, butyl cellosolve acetate, cyclohexanone, cyclohexanol, isophorone, dipropylene glycol, propylene glycol monomethyl ether, propylene glycol monomethyl ether acetate, butylcarbitol methyl-3-hydroxyhexanoate, trimethylpentanediol monoisobutyrate, pine oil, mineral sprit.

Preferably, the resin binder is mixed in a ratio of from 0.5 to 15.0 parts by weight relative to 100 parts by weight of the metal powder, and the organic solvent is in a ratio of from 5 to 100 parts by weight relative to 100 parts by weight of the solid component and the resin binder. The conductor paste may contain a small quantity of an inorganic component such as glass powder or oxide powder. The conductor paste is applied onto the green sheet to form a predetermined conductor pattern thereon, according to a known printing process such as a screen printing process or a gravure printing process.

A suitable adhesive that comprises a resin binder, a solvent and a plasticizer is applied or transferred onto the thus-obtained green sheet, and the sheet is then laminated and integrated with any other green sheet under pressure to produce a green sheet laminate. Thus obtained, the green sheet laminate is fired under a predetermined condition to obtain a ceramic structure.

A method for producing the ceramic structure of the invention is described in detail hereinunder. Specifically, FIGS. 1A to 1F show views for explaining processes of producing a green sheet with a resin sheet fitted thereto, which is to give a ceramic structure of the invention; and FIGS. 2A to 2D and FIGS. 4A to 4E show views for explaining processes of producing the ceramic structure of the invention.

In the invention, a resin sheet 2 which is thermally decomposable in a firing step is fitted into the through-hole 3 of a ceramic green sheet 1 before lamination of the sheet under pressure. As a result, the bottom of the through-hole 3 is pressed via the resin sheet 2 in the stage of pressure lamination, and the bottom of the through-hole 3 does not swell. Accordingly, high-pressure lamination with no problem of delamination is possible. The size of the through-hole 3 applicable to the invention is not specifically defined. So far as the resin sheet 2 is fittable thereinto, the through-hole 3 may cover a broad range of from a small hole to a relatively large hole.

Further, even when the wall to surround a surface recess 7 (FIGS. 2A to 2D) or inner void 10 (FIGS. 4A to 4E) is thin and weak, the thin wall around the surface recess 7 or inner void 10 is prevented from being deformed during pressure application or during green sheet working.

Next, a method of fitting the resin sheet 2 into the through-hole 3 is described. First, the through-hole 3 is formed by the use of a puncher that comprises essentially an upper mold part 4 serving as a driving member of a punching mold and a lower mold part 6 serving as a fixed member of the punching mold. As in FIG. 1A, a green sheet 1 is put on the lower mold part 6 having an opening 5 formed therein. Next, as in FIG. 1B, the upper mold part 4 is driven from the upper side of the green sheet 1 to the lower side thereof whereby the sheet 1 is punched to form the through-hole 3 as in FIG. 1C. The process thus gives the green sheet 1 with the through-hole 3 formed therein. The puncher for use herein may be so designed that the upper mold part 4 is fixed and the lower mold part 6 is driven.

Figure 1D:
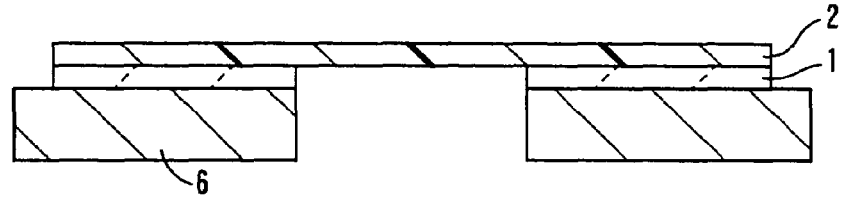
Figure 1E:
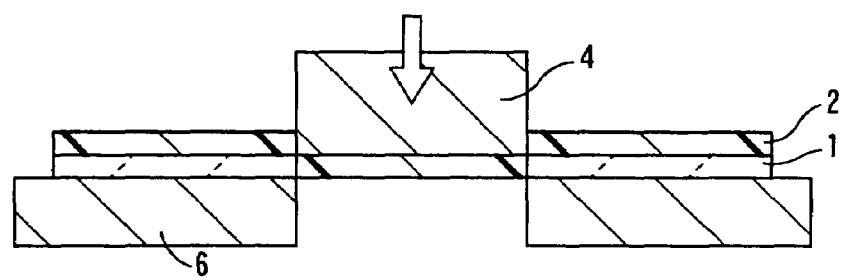
Figure 1F:
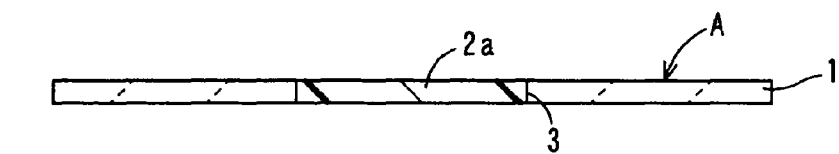

Next, as in FIG. 1D, using the same puncher, a resin sheet 2 is put on the green sheet 1 with the through-hole 3 formed therein. As in FIG. 1E, the upper mold part 4 is driven whereby the resin sheet 2 is punched and at the same time the resin sheet 2 extracted by the punching is fitted into the through-hole 3. Next, the excess resin sheet 2 is removed to give a green sheet A with the resin sheet 2 fitted into the through-hole 3, as in FIG. 1F.

Next, processes for producing a ceramic structure with the surface recess 7 are described with reference to the views of FIGS. 2A to 2D. A green sheet A1 of the uppermost resin sheet 2a fitted thereinto, a green sheet A2 of the lowermost resin sheet 2b fitted thereinto, and green sheets B1, B2 and B3 with wiring conductor layers 8 of metallized layers and via conductors 9 formed therein are laminated all at a time to give a green sheet laminate C. Next, the resin sheet 2a of the uppermost resin sheet fitted into the green sheet laminate C is removed in the first binder removal step, as in FIG. 2C; and then the resin sheet 2b of the lowermost resin sheet is removed in the second binder removal step. Finally, the green sheet laminate C is, after processed in the third binder removal step, fired to give a ceramic structure D.

On the other hand, a ceramic structure having an inner void 10 thereinside is produced according to the process of FIGS. 4A to 4E. A green sheet A1 of the uppermost resin sheet 2a fitted thereinto, a green sheet A2 of the lowermost resin sheet 2b fitted thereinto, and a green sheet 31 with a conductor paste pattern formed therein to give a wiring conductor layer 8 of a metallized layer and a via conductor 9 are laminated all at a time to give a green sheet laminate E. Next, the resin sheet 2a of the uppermost resin sheet fitted into the green sheet laminate E is removed in the first binder removal step, as in FIG. 4C, and then the resulting laminate E is once cooled to room temperature. Next, a green sheet F is laminated on the green sheet laminate E under a necessary lowermost pressure to form a ceramic laminate G having an inner void 10 formed thereinside. Further, the resin sheet 2b of the lowermost resin sheet is removed in the second binder removal step. Finally, the green sheet laminate G is, after processed in the third binder removal step, fired to give a ceramic structure H.

In the method of the invention as above, the bottom of the through-hole 3 is not too much pressed to swell, and therefore the lamination of the constitutive layers may be attained under high pressure to give ceramic structures D and H with no delamination trouble.

Next, a method for producing the resin sheet 2; 2a, 2b of the invention is described. Preferably, the resin sheet 2; 2a, 2b of the invention contains resin beads, a resin binder, and at least either a plasticizer or a lubricant. The necessary properties of the resin sheet 2; 2a, 2b are good punching workability (shearing workability) and good thermal decomposability in the firing step, and for the good punching workability thereof, adding powdery resin beads to the resin sheet is effective. The resin beads are not specifically defined so far as they exhibit good thermal decomposition behavior in firing. Preferably, they are acrylic resin beads or α-methylatyrene-based resin beads. Also preferably, the resin beads have a mean particle size of from 1 to 20 μm. Resin beads having a mean particle size of smaller than 1 μm will be problematic in point of their aggregation; and those having a mean particle size of larger than 20 μm will be problematic in that they may form protrusions on the surface of the resin sheet 2; 2a, 2b. The resin beads for use herein may have a hollow structure. Those having such a hollow structure have a reduced resin content and are therefore advantageous for use herein since the sheet attack to the green sheet is reduced during resin removal from the sheet.

In view of their solvent resistance, the resin beads are preferably crosslinked ones. However, those too much crosslinked will be problematic in that their thermal decomposability may lower.

Resin beads and a resin binder are dispersed in one or more organic solvents selected from aromatic hydrocarbons such as toluene, benzene, xylene; esters such as ethyl acetate, butyl acetate, isobutyl acetate; ketones such as methyl isobutyl ketone, methyl ethyl ketone, acetone; aliphatic hydrocarbons such as hexane, heptane; ethers such as diethyl ether, dipropyl ether, tetrahydrofuran; alcohols such as methanol, ethanol, isopropyl alcohol, butanol; and cellosolves such as ethyl cellosolve.

The resin binder for use in the resin sheet 2; 2a, 2b is not specifically defined, so far as the resin binder has good thermal decomposability. Preferably, the resin binder is an acrylic resin binder or an α-methylstyrene-based resin binder. The acrylic resin includes homopolymers or copolymers of acrylic acid, methacrylic acid or their ester, concretely acrylic acid ester copolymers, methacrylic acid ester copolymers and copolymers of acrylic acid ester and methacrylic acid ester. Examples of acrylic monomers are methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, tert-butyl acrylate, tert-butyl methacrylate, cyclohexyl acrylate, cyclohexyl methacrylate, 2-ethylhexyl acrylate, 2-ethylhexyl methacrylate. One or more such acrylic resins may be suitably selected and used herein either singly or as combined. Of those, especially preferred are homopolymers or copolymers of isobutyl methacrylate (IBMA)-based or methyl methacrylate (MMA)-based resin binders. Not detracting from the thermal decomposability of the binder resin, any of styrene, α-methylstyrene, acrylonitrile, ethylene or the like copolymerizable with acrylic resin may be suitably introduced into the binder resin. At least one selected from those comonomers may be introduced into the binder resin.

A plasticizer may be added to the resin sheet 2; 2a, 2b for making the sheet softer and more flexible. The plasticizer is not specifically defined, so far as it does not detract from the thermal decomposability of the resin sheet. For example, the plasticizer includes phthalates such as dimethyl phthalate, dibutyl phthalate, di-2-ethylhexyl phthalate, diheptyl phthalate, di-n-octyl phthalate, diisononyl phthalate, diisodecyl phthalate, butylbenzyl phthalate, ethyl phthalylethyl glycolate, butyl phthalylbutyl glycolate; and aliphatic esters such as di-2-ethylhexyl adipate, dibutyldiglycol adipate. The resin sheet may contain at least one selected from these plasticizers. Of those, preferred are phthalate plasticizers such as dibutyl phthalate (DEP), di-2-ethylhexyl phthalate (DOP).

A lubricant may be added to the resin sheet 2; 2a, 2b for improving the shearing workability of the resin sheet. The lubricant is not specifically defined so far as it does not detract from the thermal decomposability of the resin sheet 2; 2a, 2b. For example, the lubricant includes ethylene glycols such as diethylene glycol, triethylene glycol, polyethylene glycol, diethylene glycol methyl ether, triethylene glycol methyl ether, diethylene glycol ethyl ether, diethylene glycol n-butyl ether, triethylene glycol n-butyl ether, ethylene glycol phenyl ether, ethylene glycol n-acetate, diethylene glycol monohexyl ether, diethylene glycol monovinyl ether; propylene glycols such as dipropylene glycol, tripropylene glycol, polypropylene glycol, dipropylene glycol methyl ether, tripropylene glycol methyl ether, dipropylene glycol monoethyl ether, dipropylene glycol n-butyl ether, tripropylene glycol n-butyl ether, propylene glycol phenyl ether, ethylene glycol benzyl ether, ethylene glycol isoamyl ether; and glycerins such as glycerin, diglycerin, polyglycerin. The resin sheet may contain at least one selected from these lubricants. Of those, preferred are polyethylene glycol (PEG) and glycerin.

Preferably, the amount of the plasticizer and the lubricant is the necessary lowermost amount thereof. For example, when a large amount of plasticizer and lubricant remain in the melt composition of the resin sheet 2; 2a, 2b in firing a product having a conductor part of fine wirings or the like formed in the site thereof that is in contact with the resin sheet, then the resin binder in the conductor part that is in contact with the resin sheet will be readily melted, therefore causing various defects in that the strength of the conductor part may be lowered, the conductor part may be deformed, and the wirings may be cut or broken.

From 40 to 80 parts by weight of a resin binder and 100 parts by weight of resin beads are added to and dispersed in an organic solvent such as that mentioned hereinabove, and then from 5 to 40 parts by weight, as a total thereof, of a plasticizer and a lubricant are added thereto to prepare a slurry. This is applied onto a carrier sheet that has been processed for lubrication, according to a known coating process with a roll coater, a gravure coater or a blade coater, and dried to obtain the resin sheet 2; 2a, 2b.

Preferably, the thermal decomposability of the resin sheet 2; 2a, 2b is higher than that of the resin binder in the green sheet on which the resin sheet is put, and than that of the resin binder in the conductor part that is in contact with the resin sheet.

Concretely, it is desirable that the thermal decomposability of the resin sheet 2; 2a, 2b is higher than that of the resin binder in the green sheet that is in contact with the resin sheet 2; 2a, 2b. Specifically, in case where the strength of the green sheet lowers through the reduction in the amount of the resin binder remaining in the green sheet owing to the thermal decomposition of the resin binder in the green sheet (resin binder removal from the green sheet) and where the resin sheet 2; 2a, 2b is thereafter thermally decomposed on the brittle green sheet, then the melt of the resin sheet 2; 2a, 2b that has become liquid under heat and has high viscosity is further thermally decomposed on the surface of the green sheet that has become brittle after resin sheet removal, while boiling, vibrating and moving on every side. Accordingly, such a phenomenon is prevented that the surface of the green sheet that is in contact with the thermally decomposed part is partly hollowed out and the surface thereof is therefore eroded and broken.

On the other hand, when a conductor part with wiring or the like is formed in the site that is in contact with the resin sheet, then it is desirable that the thermal decomposability of the resin sheet 2; 2a, 2b is higher than that of the resin binder in the conductor part that is in contact with the resin sheet. More concretely, the resin sheet 2; 2a, 2b is so designed that the 20% weight reduction temperature of the resin binder in the conductor part that is in contact with the resin sheet 2; 2a, 2b is not lower than the 20% weight reduction temperature, Tc (° C.) of the resin binder in the green sheet on which the resin sheet 2; 2a, 2b is put. Accordingly in that condition, after a major part of resin sheets 2; 2a, 2b has been thermally decomposed in firing, the resin binder for the conductor paste that forms the conductor part is then thermally decomposed. Therefore, in the stage where a large amount of the melt composition of the resin sheet 2; 2a, 2b is kept still remaining, the resin binder in the conductor part that is in contact with the melt composition is not as yet thermally decomposed. As a result, the strength of the conductor part is well kept as such in that stage. Accordingly, the invention is free from the problem that the melt composition of the resin sheet 2; 2a, 2b melts the resin binder in the conductor part and the conductor part is thereby deformed to cause wiring breakdown, therefore making it possible to provide a ceramic structure of high reliability with no such defect.

The thermal decomposability of the resin sheet 2; 2a, 2b is described in detail. Preferably, the thermal decomposability of the resin sheet 2; 2a, 2b is so controlled that the resin sheet begins to thermally decompose from the uppermost resin sheet 2a gradually toward the lower resin sheet and finally its thermal decomposition is completed at the lowermost resin sheet 2b. Specifically, it is desirable that the thermal decomposability of the uppermost resin sheet 2a is higher than that of the lowermost resin sheet 2b.

The effect that results from the difference in the thermal decomposability between the uppermost resin sheet 2a and the lowermost resin sheet 2b of the resin sheet is described for two cases, (1) one is a ceramic structure having the surface recess 7; and (2) the other is a ceramic structure having an inner void 10 thereinside.

Figure 2A:
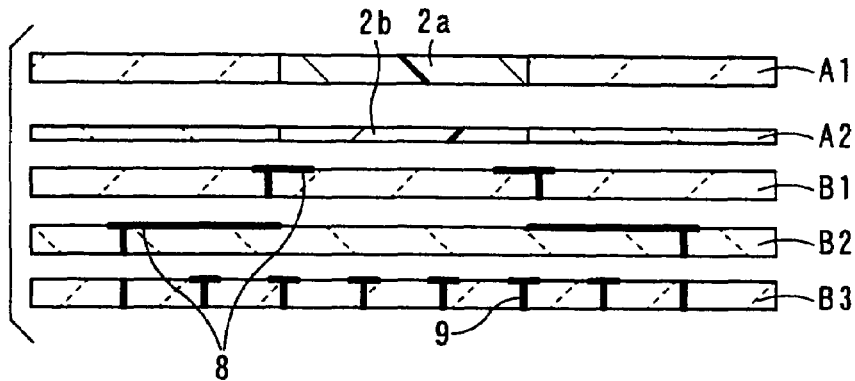
FIGS. 2A to 2D are views for explaining processes of producing a ceramic structure with a surface recess of the invention.
Figure 2B:
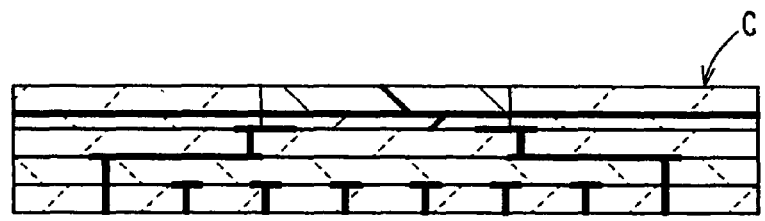
Figure 2C:
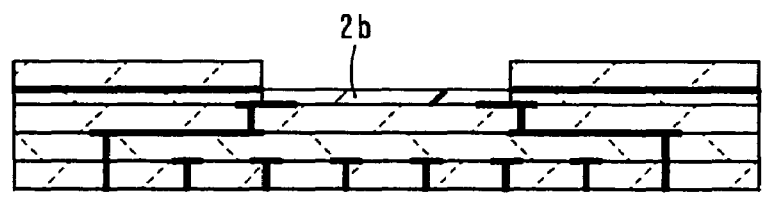
Figure 2D:
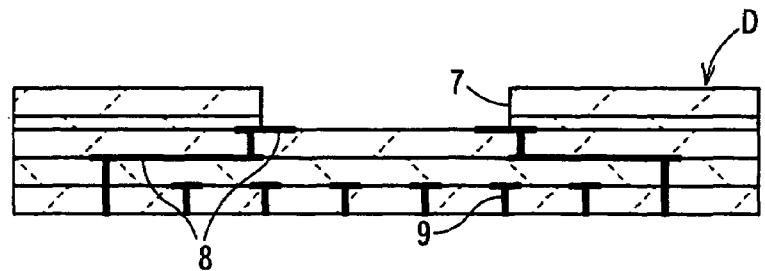
Figure 3A:
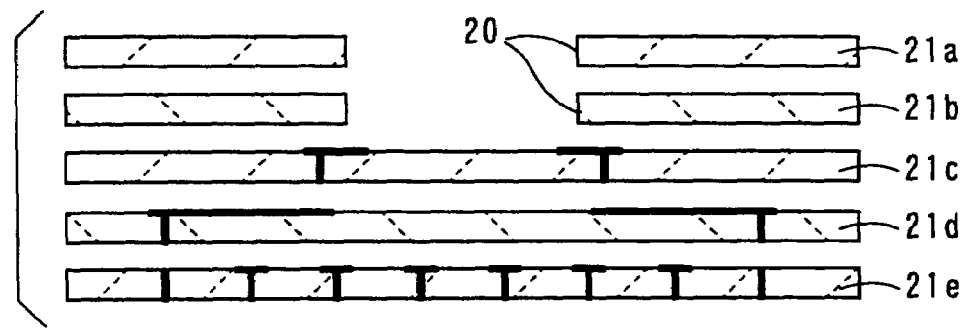
FIGS. 3A and 3B are views for explaining conventional processes of producing a ceramic structure with a surface recess.
Figure 3B:
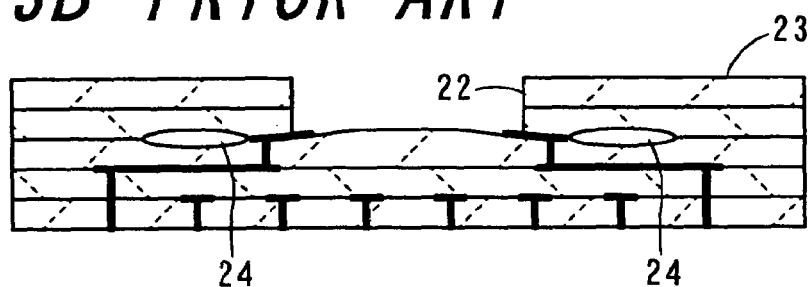

In case (1), in the first binder removal step of removing the uppermost resin sheet 2a fitted into the green sheet laminate C, the green sheet and the conductor part adjacent to the lowermost resin sheet 2b are protected by the resin sheet 2b as in FIG. 2C among the views of FIGS. 2A to 2D, and are therefore not damaged by the resin melt formed at the step of thermal decomposition of the resin sheet 2a. Accordingly, in this step, the resin sheet 2a can be safely thermally decomposed with no such problem. In the subsequent second binder removal step, the lowermost resin sheet 2b is removed, and the damage to the green sheet and the conductor part adjacent to the resin sheet 2b by the melt of the resin sheet 2 can be minimized. These effects are especially remarkable when the amount of the resin sheet 2 fitted to the surface recess 7 of the green sheet is large.

Figure 4A:
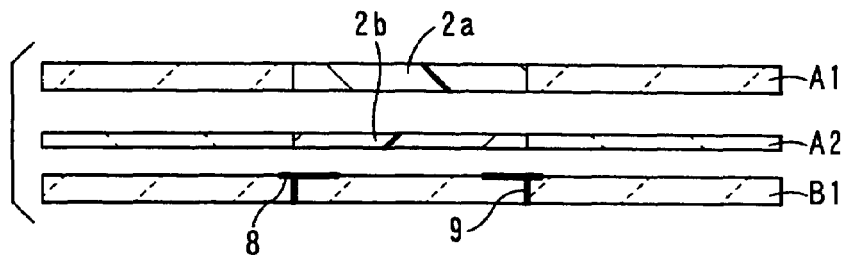
FIGS. 4A to 4E are views for explaining processes of producing a ceramic structure having an inner void thereinside of the invention.
Figure 4B:
Figure 4C:
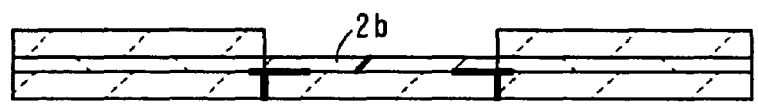
Figure 4D:
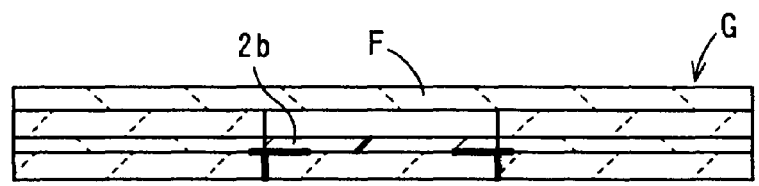
Figure 4E:
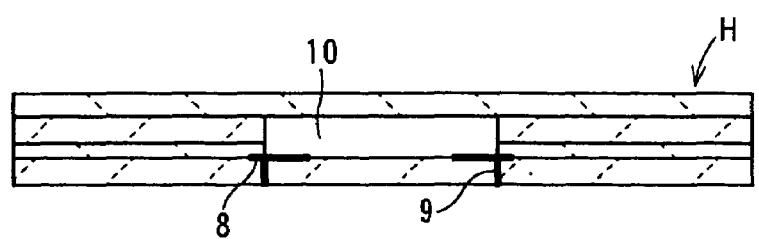

On the other hand, in case (2), the uppermost resin sheet 2a fitted into the green sheet laminate E is removed in the first binder removal step as in FIG. 4C among the views of FIGS. 4A to 4E, and the green sheet and the conductor part adjacent to the lowermost resin sheet 2b are protected by the resin sheet 2b, and are therefore not damaged by the resin melt formed at the step of thermal decomposition of the resin sheet 2a. Accordingly, in this step, the resin sheet 2a can be safely thermally decomposed with no such problem. Further, after this is once cooled to room temperature, the green sheet F is laminated on the green sheet laminate E while the inner void 10 exists in the resin sheet 2b, whereby the ceramic laminate G having the inner void 10 thereinside can be formed with no deformation trouble.

Preferably, the green sheet laminate E is cooled to a temperature lower than the glass transition temperature of the resin binder in the laminate E and the green sheet F is laminated thereon under the necessary lowermost pressure while the inner void 10 exists in the resin sheet 2b, whereby the ceramic laminate G having the inner void 10 thereinside can be formed not undergoing any pressure deformation during lamination. Next, the lowermost resin sheet 2b is removed in the subsequent second binder removal step, and the damage to the green sheet and the conductor part adjacent to the resin sheet 2b by the melt of the resin sheet 2 can be minimized.

These effects are also especially remarkable when the amount of the resin sheet 2 fitted to the inner void 10 of the green sheet is large. In addition to the effect mentioned above for preventing the negative influence of the thermally decomposed melt of the resin sheet 2 on the green sheet, the invention exhibits another effect that it is possible to prevent the negative influence of the decomposition gas to be generated in large quantities during thermal decomposition of the resin melt on the green sheet. Specifically, when the green sheet F is laminated without removing the resin sheet 2a and when the green sheet laminate having the inner void 10 filled with the resin sheet 2 is fired, then thermal decomposition of the entirety of the resin sheet 2 begins and consequently a large amount of the resulting resin melt is given. As a result, such a problem may occur that the site around the inner void 10 is deformed. In addition, in such a case, the thermal decomposition gas of the resin sheet is also generated in large quantities all at a time, and therefore, such another problem may occur that the green sheet part that surrounds the inner void 10 may be damaged by the gas pressure. For example, such a problem may occur that the green sheet F to close the inner void 10 may be cracked or deformed. Accordingly, in the method of the invention, the green sheet F is laminated after removal of a part of the resin sheet 2 in the first binder removal step to form the green sheet laminate G having the inner void 10 thereinside, and then the remaining resin sheet 2b of the lowermost resin sheet is removed in the second binder removal step, whereby the resin sheet 2 can be stepwise and gradually thermally decomposed under a mild condition and the problems as above can be solved.

For providing the difference in the thermal decomposability between the two resin sheets 2 as above, the type of the combination of the resin beads and the resin binder to constitute the uppermost resin sheet 2a and the lowermost resin sheet 2b may be changed. Specifically, the material of the uppermost resin sheet 2a is so selected that its thermal decomposability is higher than that of the material of the lowermost resin sheet 2b. Apart from the method of separately forming the resin sheets 2a and 2b for providing the difference in the thermal decomposability between the two sheets, also employable herein is another method of forming the uppermost resin sheet 2a on the lowermost resin sheet 2b according to a tape-forming process or a coating process, whereby the resin sheet 2 whose thermal decomposability stepwise varies thereinside may be used.

Regarding the thickness of the resin sheets 2a and 2b, it is desirable that the resin sheet 2a is thicker than the resin sheet 2b. This means that, in the stage where the uppermost resin sheet 2a is thermally decomposed in the first binder removal step, the lowermost resin sheet 2b preferably keeps its sheet condition in some degree so as to protect the green sheet and the conductor part existing just below the lowermost resin sheet 2b and more preferably, a major part of resin sheets 2 containing the resin sheet 2a is removed by thermal decomposition on the resin sheet 2b that has the smallest thickness at least necessary for keeping its sheet condition in the first binder removal step. In this preferred mode, therefore, the amount of the melt of the resin sheet 2b is reduced in the second binder removal step, and various troubles to the green sheet and the conductor part existing just below the sheet can be evaded.

However, in producing the ceramic structure having the inner void 10 thereinside as in FIGS. 4A to 4E, the thickness of the resin sheet 2b is so defined that the resin sheet 2b can exist in the inner void 10 when the green sheet F is laminated on the ceramic laminate F, in order that it is effective for preventing the pressure deformation around the inner void 10. In this case, when the thickness of the resin sheet 2b is excessively large and therefore when the amount of the resin sheet 2b to be fitted into the green sheet is large, then there may occur a problem in that a large quantity of thermal decomposition gas may be generated all at a time to cause damage to the green sheet F around the inner void 10. Therefore, it is desirable to select and employ a good thickness balance between the resin sheets 2a and 2b.

In the embodiments of FIGS. 2A to 2D, and FIGS. 4A to 4E, the resin sheet 2 is a combination of the uppermost resin sheet 2a and the lowermost resin sheet 2b. If desired, however, any other resin sheet may be provided between the uppermost resin sheet 2a and the lowermost resin sheet 2b. In such a case, it is desirable that the level of the thermal decomposability of the additional resin sheet is the same as that of the thermal decomposability of any one of the resin sheets 2a and 2b, or is between the level of the resin sheet 2a and that of the resin sheet 2b.

From the above, the materials to form the green sheet laminate of the invention are so designed as to satisfy a relation of $Ta < Tb \leq Tc$ in point of their thermal decomposability, in which Ta (° C.) indicates a 80% weight reduction temperature of the uppermost resin sheet 2a, Tb (° C.) indicates a 80% weight reduction temperature of the lowermost resin sheet 2b, and Tc (° C.) indicates a 20% weight reduction temperature of the resin binder to be in the ceramic green sheet to which the resin sheet 2 is fitted. For this, the materials are analyzed through thermogravimetric differential thermal analysis (TG/DTA) in an $N_2$ atmosphere up to 600° C. at a heating rate of 10° C./min by the use of-a differential high-temperature thermobalance (Rigaku Denki's TG8120). Preferably, the resin sheet 2; 2a, 2b undergoes at least 99 wt. % thermal decomposition at 600° C. or lower.

On the other hand, when a conductor part with wiring or the like is formed in the site that is in contact with the resin sheet, then it is desirable that the 20% weight reduction temperature of the resin binder in the conductor part is not lower than Tc (° C.).

The temperature profile in the binder removal process in firing the ceramic structure of the invention is preferably so designed that the process comprises a first binder removal step for thermal decomposition and removal of the resin sheet 2a by satisfactorily keeping the resin sheet 2a at a temperature around Ta (° C.) at which most of the resin sheet 2a is thermally decomposed, for a predetermined period of time, for example, for 1 hour to 6 hours, a second binder removal step for thermal decomposition and removal of the resin sheet 2b by satisfactorily keeping the resin sheet 2b at Tb (° C.) for a predetermined period of time, for example, for 1 hour to 6 hours, and a third binder removal step of keeping the resulting laminate structure at a temperature higher than Tc (° C.) for a predetermined period of time, for example, for 1 hour to 6 hours. In each step, the retention time varies depending on the amount and the type of the resin binder, and is not specifically defined.

The process specifically designed in the manner as above makes it possible to initiate the thermal decomposition of the resin binder in the green sheet and in the conductor part after the thermal decomposition of most part of the resin sheets 2; 2a, 2b. In other words, in the process, the resin binder in the green sheet and in the conductor part does not begin to thermally decompose in the stage where a melt of the resin sheet 2; 2a, 2b still remains in the green sheet, and therefore, the green sheet can keep sufficient strength. Accordingly, the melt of the resin sheet 2; 2a, 2b is prevented from eroding and breaking the green sheet and the conductor part that is in contact with the melt. In addition, since the laminate structure is kept at a temperature higher than Tc (° C.) for a predetermined period of time in the third step, the resin binder in the green sheet and in the conductor part can be sufficiently thermally decomposed.

Thus obtained in the manner as above, the ceramic structure of the invention has a complicated form with at least either a surface recess 7 or inner void 10, and its application examples are mentioned below.

For example, the ceramic structure is applicable to:

(1) waveguides and waveguide circuit boards with a conductor layer formed inside the surface recess 7 or inner void 10; wiring boards having circuit wiring, capacitor, inductance and the like thereon with a conductor filled in the surface recess 7 or inner void 10, (2) electronic parts packages for housing semiconductor integrated circuit devices such as LSI, piezoelectric oscillators such as quartz oscillators, light-receiving devices such as photodiodes or CCD devices, other various sensor devices and various electronic parts, in which the waveguide circuit board or the wiring board of (1) is used, (3) millimeter wave circuits comprising the waveguide, the waveguide circuit or the wiring board of (1); millimeter wave radars for automobiles comprising the millimeter wave circuit, (4) non-radiative dielectric lines with a conductor layer formed in the bottom of the surface recess and with a dielectric wiring path provided inside the surface recess 7 in which the surface recess 7 is closed with a conductor plate; millimeter wave radars for automobiles comprising the line, (5) fuel cells and fuel cell reformers comprising flow paths formed therein for carrying fuel such as oxygen gas, hydrogen gas, alcohol, hydrocarbon gas and others therethrough, (6) microchemical chips and microfluidics comprising flow paths for carrying chemical liquid, body fluid such as blood, solution for chemical reaction, or solution containing gene, bacteria, viruses or the like therethrough, reaction zones, processing zones and heating zones connected to the flow paths, and collectors for collecting processed liquid, (7) inkjet printer heads comprising a piezoelectric material for jetting out ink through the inner void 10 or the flow path formed thereinside according to the piezoelectric effect thereof, (8) piezoelectric devices such as actuators comprising a piezoelectric material and having the surface recess 7 or inner void 10 formed therein, (9) optical parts and substrates having a conductor layer formed inside the surface recess 7 or inner void 10 for carrying electronic parts thereon; optical parts and substrates having a light path formed by the surface recess 7 or inner void 10,

(10) substrates for MEMS (microelectromechanical systems) having a conductor layer formed inside the surface recess 7 or inner void 10 for carrying electronic parts thereon; substrates for MEMS having a light path or a flow path formed by the surface recess 7 or inner void 10,

(11) radio wave absorbents having multiple fractal-structured inner voids 10 formed thereinside.

EXAMPLES

Examples of the resin sheet of the invention and examples of the method for producing a ceramic structure using the resin sheet are described below.

The resin sheets were analyzed through thermogravimetric differential thermal analysis (TG/DTA) in an $N_2$ atmosphere up to 600° C. at a heating rate of 10° C./min by the use of a differential high-temperature thermobalance (Rigaku Denki's TG8120).

Example 1

Ceramic Structure Having a Surface Recess 7:

1. Preparation of Green Sheet:

11 parts by mass of a binder, methyl acrylate/methyl methacrylate copolymer composition and 5 parts by mass of a plasticizer, dibutyl phthalate were added to 100 parts by mass of a glass ceramic material powder comprising $SiO_2$, $Al_2O_3$, CaO, ZnO and $B_2O_3$, and mixed in an organic solvent, toluene in a ball mill for 36 hours to prepare a slurry. According to a doctor blade process, the resulting slurry was shaped and dried to give a green sheet having a thickness of 0.6 mm or 0.3 mm. Next, the green sheet was punched to form through-holes each having a diameter of 200 μm.

Next, a conductor paste for through-holes mentioned below was applied to the green sheet according to a screen printing process to thereby fill the through-holes in the sheet. Next, a conductor paste for wirings mentioned below was applied to the green sheet also according to a screen printing process to thereby form a wiring pattern thereon having a thickness of 15 μm, and then this was dried in a hot air drier furnace at 80° C. for 1 hour to form a metallized wiring.

2. Formation of Conductor Paste:

(2-1) Conductor Paste for filling through-holes (conductor paste for forming via conductor):

To 100 parts by mass of Cu powder, added were 2 parts by weight of a resin binder, methyl acrylate/methyl methacrylate copolymer composition (this is the same as that for the green sheet), 4 parts by weight of a mixed solvent of terpineol and butylcarbitol acetate and 2 parts by weight of a phthalate plasticizer (mixture of DOP (di-2-ethylhexyl phthalate) and DBP (dibutyl phthalate)), and these were stirred and mixed. Next, this was further milled in a three-roll mill until the disappearance of the aggregates of the Cu powder and the resin binder, and a conductor paste was thus prepared.

(2-2) Conductor Paste for Wirings:

To 100 parts by mass of Cu powder, added were 3 parts by weight of a resin binder, methyl acrylate/methyl methacrylate copolymer composition (this is the same as that for the green sheet), 10 parts by weight of a mixed solvent of terpineol and butylcarbitol acetate and 10 parts by weight of a phthalate plasticizer (mixture of DOP and DBP), and these were stirred and mixed. Next, this was further milled in a three-roll mill until the disappearance of the aggregates of the Cu powder and the resin binder, and a conductor paste was thus prepared.

3. Formation of Resin Sheet:

A composition prepared by adding 55 parts by weight of a resin binder, isobutyl methacrylate, 5 parts by weight of DOP, 5 parts by weight of polyethylene glycol and 150 parts by weight of methyl isobutyl ketone to 100 parts by weight of resin beads of crosslinked isobutyl methacrylate was stirred to give a slurry. According to a doctor blade process, the slurry was shaped and dried to give a resin sheet 2a having a thickness of 600 μm.

Similarly, a composition prepared by adding 55 parts by weight of a resin binder, n-butyl methacrylate, 5 parts by weight of DOP, 5 parts by weight of polyethylene glycol and 150 parts by weight of methyl isobutyl ketone to 100 parts by weight of resin beads of crosslinked n-butyl methacrylate was stirred to give a slurry. According to a doctor blade process, the slurry was shaped and dried to give a resin sheet 2b having a thickness of 300 μm.

4. Formation of Ceramic Structure with surface Recess 7:

Using the resin sheets 2a and 2b, a green sheet laminate was formed as in FIGS. 2A to 2D. Concretely, according to the punching process of FIGS. 1A to 1F, the resin sheets 2a and 2b were fitted into a green sheet A1 (length 50 mm×width 50 mm×thickness 0.6 mm; size of through-hole, length 2 mm×width 2 mm×depth 0.6 mm) and a green sheet A2 (length 50 mm×width 50 mm×thickness 0.3 mm; size of through-hole, length 2 mm×width 2 mm×depth 0.3 mm), respectively.

Next, green sheets A1, A2, B1, B2 and B3 each coated with an adhesive comprising an acrylic resin, a solvent and a phthalate plasticizer were laminated under a pressure of 4.9 MPa, and the five green sheets were thereby integrated to form a green sheet laminate having an inner wiring. Next, the green sheet laminate was put on an $Al_2O_3$ setter, and kept in a mixed atmosphere firing furnace filled with nitrogen, hydrogen and steam, at 310° C. near to the 80% weight reduction temperature Ta (° C.) of the resin sheet 2a for 3 hours, whereby the resin sheet 2a was fully removed. Next, this was kept at 330° C. near to the 80% weight reduction temperature $T_b$ (° C.) of the resin sheet 2*b* for 3 hours, whereby the resin sheet 2*b* was fully removed. Next, this was further kept at 850° C. within a temperature range higher than the 20% weight reduction temperature $T_c$ (° C.) of the resin binder in the green sheet, for 3 hours for binder removal, and then fired at 950 to 1000° C.

The thermogravimetric differential thermal analysis data of the resin sheets and the resin binder were as follows:

$T_a=306°$ C., $T_b=326°$ C., $T_c=332°$ C.

Comparative Example 1

A ceramic structure was formed in the same manner as in Example 1, for which, however, the same isobutyl methacrylate-based resin beads and resin binder were used in the two resin sheets 2*a* and 2*b*. The firing profile was as follows. The laminate was kept at 310° C. for 3 hours, then kept at 330° C. for 3 hours, and further kept at 850° C. for 3 hours for binder removal, and thereafter fired at 950 to 1000° C.

The thermogravimetric differential thermal analysis data of the resin sheets and the resin binder were as follows:

$T_a=T_b310°$ C., $T_c=332°$ C.

Comparative Example 2

A ceramic structure was formed in the same manner as in Example 1, for which, however, n-butyl methacrylate-based resin beads and resin binder were used in the resin sheet 2*a* and isobutyl methacrylate-based resin beads and resin binder were used in the resin sheet 2*b*. The firing profile was as follows. The laminate was kept at 310° C. for 3 hours, then kept at 330° C. for 3 hours, and further kept at 850° C. for 3 hours for binder removal, and thereafter fired at 950 to 1000° C.

The thermogravimetric differential thermal analysis data of the resin sheets and the resin binder were as follows:

$T_a=326°$ C., $T_b=306°$ C., $T_c=332°$ C.

Comparative Example 3

A ceramic structure was formed in the same manner as in Example 1, for which, however, the same ethyl cellulose-based resin beads and resin binder were used in the two resin sheets 2*a* and 2*b*. The firing profile was as follows. The laminate was kept at 310° C. for 3 hours, then kept at 330° C. for 3 hours, and further kept at 850° C. for 3 hours for binder removal, and thereafter fired at 950 to 1000° C.

The thermogravimetric differential thermal analysis data of the resin sheets and the resin binder were as follows:

$T_a=T_b=363°$ C., $T_c=332°$ C.

Comparative Example 4

A ceramic structure was formed in the same manner as in Example 1, for which, however, the resin sheets 2*a* and 2*b* were not used.

The thermogravimetric differential thermal analysis data of the resin sheets and the resin binder used in the green sheet in Example 1 and Comparative Examples 1 to 4 are shown in Table 1.

TABLE 1

| | Resin Sheet Materials (resin components) 2a/2b | 80% Weight Reduction Temperature (° C.) | | Temperature Difference (° C.) | | 600° C. Residue of Resin Sheet (%) |
|---|---|---|---|---|---|---|
| | | Ta | Tb | Tb − Ta | Tc − Tb | |
| Example 1 | IBMA/BMA | 306 | 326 | 20 | 6 | 0.6 |
| Comparative Example 1 | IBMA/IBMA | 310 | 310 | 0 | 22 | 0.3 |
| Comparative Example 2 | BMA/IBMA | 326 | 306 | −20 | 26 | 0.5 |
| Comparative Example 3 | EC/EC | 363 | 363 | 0 | −31 | 4.5 |
| Comparative Example 4 | — | — | — | — | — | — |

Abbreviations of Resin Sheet Materials:
Acrylic Resins: IBMA, isobutyl methacrylate; BMA, n-butyl methacrylate.
Cellulosic Resin: EC, ethyl cellulose.

Table 2 shows the test results of the ceramic structures obtained herein. The surface condition of the green sheet to form the bottom of the surface recess 7 kept in contact with the resin sheet 2 was observed with a scanning electron microscope, and checked for abnormality. The condition of the conductor part in the bottom of the surface recess 7 was also observed with the scanning electron microscope, and checked for abnormality. Further, the conductor part was tested for electric conduction therethrough, and checked for wiring breakdown to confirm the percent defective. On the other hand, the profile of the bottom of the surface recess 7 was analyzed by the use of a high-speed three-dimensional profile-analyzing system (Coms' EMS98AD-3D100XY). The difference between the highest height and the lowest height of the bottom surface thus measured indicates the warp maximum of the bottom. The wall surrounding the surface recess 7 was observed with the scanning electron microscope and checked for deformation. Finally, the ceramic structure was cut, and its cross section was observed with the scanning electron microscope and checked for delamination (interlayer adhesion failure).

TABLE 2

|  | Surface Condition of Recess Bottom | Bottom Conductor Part Condition | Percentage Defective of Wiring Breakdown (%) | Profile of Recess Wall | Warp Maximum of Bottom (μm) | Interlayer Adhesion Failure in Multilayer Printed Circuit Board |
|---|---|---|---|---|---|---|
| Example 1 | Good | Good | 0 | Good | 10 | No |
| Comparative Example 1 | Good | Partly eroded | 0 | Good | 13 | No |
| Comparative Example 2 | Partly eroded | Partly eroded | 2 | Good | 18 | No |
| Comparative Example 3 | Eroded and broken | Eroded and broken | 63 | Good | 20 | No |
| Comparative Example 4 | Good | Good | 0 | Deformed | 44 | Yes |

Table 2 confirms the following. Example 1 satisfies the relation of $T_a < T_b \leq T_c$. In this, the resin sheets underwent at least 99 wt. % thermal decomposition at 600° C. or lower, and therefore the green sheet disposed at the bottom of the surface recess 7 was free from abnormality of deformation- or erosion. A sintered body of good dimensional accuracy was obtained. Since a resin binder having a 20% weight reduction temperature $T_c$ (° C.) was used in the conductor part, there occurred no trouble of wiring breakdown. The resin thermal decomposition gave no residue (carbon).

Comparative Example 1 satisfies a relation of $T_b \leq T_c$, in which, however, $T_a = T_b$. Therefore, in this, the resin sheets thermally decomposed all at a time, and a large amount of the resulting resin melt caused damage to the conductor part adjacent to the resin sheets. The surface of the conductor part was partly eroded, but no wiring breakdown occurred.

Comparative Example 2 satisfies a relation of $T_b \leq T_c$, in which, however, $T_a > T_b$. In this, the resin sheet 2b of the lowermost layer began to thermally decompose before the resin sheet 2a of the uppermost layer, and therefore its thermal decomposition was retarded by the resin sheet 2a that covers the melt of the resin sheet 2b. Accordingly, the green sheet and the conductor part adjacent to the resin sheet 2b was kept receiving the influence of the melt of the resin sheet 2b thereon for a longer period of time, and they were much damaged by the resin melt. As a result, they were partly eroded on the surface. In addition, the conductor part was partly broken down.

In Comparative Example 3, $T_a = T_b > T_c$. In this, therefore, since the resin binder in the green sheet and the conductor part thermally decomposed before the resin sheet 2, the strength of the green sheet and the conductor part lowered owing to the reduction in the resin binder therein through thermal decomposition thereof. With that, the resin sheet began to thermally decompose later, and the green sheet and the conductor part were thereby eroded and broken and their surface condition was roughened. As a result, the bottom warp of the surface recess 7 was high in some degree and the frequency of wiring breakdown increased. Further, a thermal decomposition residue of the resin sheet, carbide remained in the bottom of the surface recess.

In Example 1 and Comparative Examples 1 to 3, since the green sheet with a resin sheet fitted thereto was laminated under pressure, the swollen warp maximum of the bottom part of the surface recess 7 was reduced and there occurred no trouble of ceramic interlayer adhesion failure (delamination).

In Comparative Example 4, no resin sheet was used. Therefore, in this, the warp maximum of the bottom part of the surface recess 7 was high and the wall around the surface recess 7 deformed. In addition, there occurred a trouble of ceramic interlayer adhesion failure (delamination).

Example 2

Ceramic Structure Having Inner Void 10:

1. Preparation of Green Sheet:

11 parts by mass of a resin binder, methyl acrylate/methyl methacrylate copolymer composition and 5 parts by mass of a plasticizer, dibutyl phthalate were added to 100 parts by mass of a glass ceramic material powder comprising $SiO_2$, $Al_2O_3$, CaO, ZnO and $B_2O_3$, and mixed in an organic solvent, toluene in a ball mill for 36 hours to prepare a slurry. According to a doctor blade process, the resulting slurry was shaped and dried to give a green sheet having a thickness of 0.6 mm or 0.3 mm. Next, the green sheet was punched to form through-holes each having a diameter of 200 μm.

Next, a conductor paste for through-holes mentioned below was applied to the green sheet according to a screen printing process to thereby fill the through-holes in the sheet. Next, a conductor paste for wirings mentioned below was applied to the green sheet also according to a screen printing process to thereby form a wiring pattern thereon having a thickness of 15 μm, and then this was dried in a hot air drier furnace at 80° C. for 1 hour to form a metallized wiring.

2. Formation of Conductor Paste:

(2-1) Conductor Paste for filling through-holes (conductor paste for forming via conductor):

To 100 parts by mass of Cu powder, added were 2 parts by weight of a binder, methyl acrylate/methyl methacrylate copolymer composition (this is the same as that for the green sheet), 4 parts by weight of a mixed solvent of terpineol and butylcarbitol acetate and 2 parts by weight of a phthalate plasticizer (mixture of DOP and DBP), and these were stirred and mixed. Next, this was further milled in a three-roll mill until the disappearance of the aggregates of the Cu powder and the resin binder, and a conductor paste was thus prepared.

(2-2) Conductor Paste for wirings:

To 100 parts by mass of Cu powder, added were 3 parts by weight of a binder, methyl acrylate/methyl methacrylate copolymer composition (this is the same as that for the green sheet), 10 parts by weight of a mixed solvent of terpineol and butylcarbitol acetate and 10 parts by weight of a phthalate plasticizer (mixture of DOP and DBP), and these were stirred and mixed. Next, this was further milled in a three-roll mill until the disappearance of the aggregates of the Cu powder and the resin binder, and a conductor paste was thus prepared.

3. Formation of Resin Sheet:

A composition prepared by adding 55 parts by weight of a resin binder, isobutyl methacrylate, 5 parts by weight of DOP, 5 parts by weight of polyethylene glycol and 150 parts by weight of methyl isobutyl ketone to 100 parts by weight of resin beads of crosslinked isobutyl methacrylate was stirred to give a slurry. According to a doctor blade process, the slurry was shaped and dried to give a resin sheet 2a having a thickness of 600 μm.

Similarly, a composition prepared by adding 55 parts by weight of a resin binder, n-butyl methacrylate, 5 parts by weight of DOP, 5 parts by weight of polyethylene glycol and 150 parts by weight of methyl isobutyl ketone to 100 parts by weight of resin beads of crosslinked n-butyl methacrylate was stirred to give a slurry. According to a doctor blade process, the slurry was shaped and dried to give a resin sheet 2b having a thickness of 300 μm.

4. Formation of Ceramic Structure with Inner Void 10:

Using the resin sheets 2a and 2b, a green sheet laminate was formed as in FIGS. 2A to 2D. Concretely, according to the punching process of FIGS. 1A to 1F, the resin sheets 2a and 2b were fitted into a green sheet A1 (length 50 mm×width 50 mm×thickness 0.6 mm; size of through-hole, length 2 mm×width 2 mm×depth 0.6 mm) and a green sheet A2 (length 50 mm×width 50 mm×thickness 0.3 mm; size of through-hole, length 2 mm×width 2 mm×depth 0.3 mm), respectively.

Next, green sheets A1, A2 and B1 each coated with an adhesive comprising an acrylic resin, a solvent and a phthalate plasticizer were laminated under a pressure of 4.9 MPa, and the three green sheets were thereby integrated to form a green sheet laminate having an inner wiring. Next, the green sheet laminate was put on an $Al_2O_3$ setter, and kept in a mixed atmosphere firing furnace filled with nitrogen, hydrogen and steam, at 310° C. near to the 80% weight reduction temperature $T_a$ (° C.) of the resin sheet 2a for 3 hours, whereby the resin sheet 2a was fully removed. With that, this was once cooled to room temperature, and a green sheet F was laminated on the green sheet laminate under a pressure of 1 MPa. Thus obtained, the ceramic laminate G having the inner void 10 thereinside was kept at 330° C. near to the 80% weight reduction temperature $T_b$ (° C.) of the resin sheet 2b for 3 hours, whereby the resin sheet 2b was fully removed. Next, this was further kept at 850° C. within a temperature range higher than the 20% weight reduction temperature $T_c$ (° C.) of the resin binder in the green sheet, for 3 hours for binder removal, and then fired at 950 to 1000° C.

The thermogravimetric differential thermal analysis data of the resins were as follows:

$T_a=309°$ C., $T_b=328°$ C., $T_c=332°$ C.

Comparative Example 5

A ceramic structure was formed in the same manner as in Example 2, for which, however, the same isobutyl methacrylate-based resin beads and resin binder were used in the two resin sheets 2a and 2b. The firing profile was as follows. The laminate was kept at 310° C. for 3 hours, then kept at 330° C. for 3 hours, and further kept at 850° C. for 3 hours for binder removal, and thereafter fired at 950 to 1000° C.

The thermogravimetric differential thermal analysis data of the resins were as follows;

$T_a=T_b=305°$ C., $T_c=332°$ C.

Comparative Example 6

A ceramic structure was formed in the same manner as in Example 2, for which, however, n-butyl methacrylate-based resin beads and resin binder were used in the resin sheet 2a and isobutyl methacrylate-based resin beads and resin binder were used in the resin sheet 2b. The firing profile was as follows. The laminate was kept at 310° C. for 3 hours, then kept at 330° C. for 3 hours, and further kept at 850° C. for 3 hours for binder removal, and thereafter fired at 950 to 1000° C.

The thermogravimetric differential thermal analysis data of the resins were as-follows:

$T_a=331°$ C., $T_b=309°$ C., $T_c=332°$ C.

Comparative Example 7

A ceramic structure was formed in the same manner as in Example 2, for which, however, the same ethyl cellulose-based resin beads and resin binder were used in the two resin sheets 2a and 2b. The firing profile was as follows. The laminate was kept at 310° C. for 3 hours, then kept at 330° C. for 3 hours, and further kept at 850° C. for 3 hours for binder removal, and thereafter fired at 950 to 1000° C.

The thermogravimetric differential thermal analysis data of the resins were as follows:

$T_a=T_b=358°$ C., $T_c 32\ 332°$ C.

Comparative Example 8

A ceramic structure was formed in the same manner as in Example 2, for which, however, the resin sheets 2a and 2b were not used.

The thermogravimetric differential thermal analysis data of the resin sheets and the resin binder used in the green sheet and the conductor part in Example 2 and Comparative Examples 5 to 8 are shown in Table 3.

TABLE 3

| | Resin Sheet Materials | 80% Weight Reduction Temperature (° C.) | | Temperature Difference (° C.) | | 600° C. Residue |
|---|---|---|---|---|---|---|
| | (resin components) 2a/2b | Ta | Tb | Tb − Ta | Tc − Tb | of Resin Sheet (%) |
| Example 2 | IBMA/BMA | 309 | 328 | 19 | 4 | 0.5 |
| Comparative Example 5 | IBMA/IBMA | 305 | 305 | 0 | 27 | 0.2 |
| Comparative Example 6 | BMA/IBMA | 331 | 309 | −22 | 23 | 0.5 |

TABLE 3-continued

|  | Resin Sheet Materials (resin components) 2a/2b | 80% Weight Reduction Temperature (° C.) Ta | 80% Weight Reduction Temperature (° C.) Tb | Temperature Difference (° C.) Tb − Ta | Temperature Difference (° C.) Tc − Tb | 600° C. Residue of Resin Sheet (%) |
|---|---|---|---|---|---|---|
| Comparative Example 7 | EC/EC | 358 | 358 | 0 | −26 | 4.3 |
| Comparative Example 8 | — | — | — | — | — | — |

Abbreviations of Resin Sheet Materials:
Acrylic Resins: IBMA, isobutyl methacrylate; BMA, n-butyl methacrylate.
Cellulosic Resin: EC, ethyl cellulose.

Table 4 shows the test results of the ceramic structures obtained herein. The surface condition of the bottom of the inner void 10 of the green sheet kept in contact with the green sheet 2 was observed with the scanning electron microscope, and checked for abnormality. The condition of the conductor part in the bottom of the inner void 10 was also observed with the scanning electron microscope, and checked for abnormality. Further, the conductor part was tested for electric conduction therethrough, and checked for wiring breakdown to confirm the percent defective. On the other hand, the profile of the bottom of the inner void 10 was analyzed by the use of a high-speed three-dimensional profile-analyzing system (Coms' EMS98AD-3D100XY). The difference between the highest height and the lowest height of the bottom surface thus measured indicates the warp maximum of the bottom. The top and the wall surrounding the inner void 10 were observed with the scanning electron microscope and checked for deformation. Finally, the ceramic structure was cut, and its cross section was observed with the scanning electron microscope and checked for delamination (interlayer adhesion failure).

was partly eroded, but no wiring breakdown occurred. In addition, the large amount of the gas formed through the sudden thermal decomposition was shut up in the closed space of the inner void 10, and the gas pressed the top lid of the inner void 10. As a result, the top of the inner void was partly cracked.

Comparative Example 6 satisfies a relation of $T_b \leq T_c$, in which, however, $T_a > T_b$. In this, the resin sheet 2b of the lowermost layer began to thermally decompose before the resin sheet 2a of the uppermost layer, and therefore its thermal decomposition was retarded by the resin sheet 2a that covers the melt of the resin sheet 2b. Accordingly, the green sheet and the conductor part adjacent to the resin sheet 2b was kept receiving the influence of the melt of the resin sheet 2b thereon for a longer period of time, and they were much damaged by the resin melt, As a result, the green sheet and the conductor part were partly eroded on the surface. In addition, the conductor part was partly broken down.

In Comparative Example 7, $T_a = T_b > T_c$. In this, therefore, since the resin binder in the green sheet and the conductor part thermally decomposed before the resin sheet 2, the

TABLE 4

|  | Bottom Conductor Part | Bottom Conductor Part | Bottom Conductor Part | Profile of Inner void | Profile of Inner void | Profile of Inner void | Interlayer Adhesion |
|---|---|---|---|---|---|---|---|
|  | Surface Condition of Inner void Bottom | Condition | Percentage Defective of Wiring Breakdown (%) | Top | Wall | Warp Maximum of Bottom (μm) | Failure in Multilayer Printed Circuit Board |
| Example 2 | Good | Good | 0 | Good | Good | 11 | No |
| Comparative Example 5 | Good | Partly eroded | 0 | Partly cracked | Good | 14 | No |
| Comparative Example 6 | Partly eroded | Partly eroded | 2 | Good | Good | 16 | No |
| Comparative Example 7 | Eroded and broken | Eroded and broken | 58 | Cracked | Good | 19 | No |
| Comparative Example 8 | Good | Good | 0 | Good | Deformed | 41 | Yes |

Table 4 confirms the following. Example 2 satisfies the relation of $T_a < T_b \leq T_c$. In this, the resin sheet 2 underwent at least 99 wt. % thermal decomposition at 600° C. or lower, and therefore the green sheet around the inner void 10 was free from abnormality of deformation or erosion. A sintered body with no thermal decomposition residue (carbon) was obtained. Since a resin binder having a 20% weight reduction temperature $T_c$ (° C.) was used in the conductor part, there occurred no trouble of wiring breakdown.

Comparative Example 5 satisfies a relation of $T_b \leq T_c$, in which, however, $T_a = T_b$. Therefore, in this, the resin sheet 2 thermally decomposed all at a time, and a large amount of the resulting resin melt caused damage to the conductor part adjacent to the resin sheet. The surface of the conductor part strength of the green sheet and the conductor part lowered owing to the reduction in the resin binder therein through thermal decomposition thereof. With that, the resin sheet 2 began to thermally decompose later, and the green sheet and the conductor part were thereby eroded and broken and their surface condition was roughened. As a result, the bottom warp of the inner void 10 was high in some degree and the frequency of wiring breakdown increased. Further, since the top lid of the inner void 10, of which the strength had been lowered, was pressed by the decomposition gas generated by the thermal decomposition, the top lid was cracked. In addition, a thermal decomposition residue of the resin sheet, carbide remained in the bottom of the inner void.

In Example 2 and Comparative Examples 5 to 7, since the green sheet with a resin sheet fitted thereto was laminated under pressure, the swollen warp maximum of the bottom part of the inner void 10 was reduced and there occurred no trouble of ceramic interlayer adhesion failure (delamination).

In Comparative Example 8, the resin sheet 2 was not used. Therefore, in this, the warp maximum of the bottom part of the inner void 10 was high and the wall around the inner void 10 deformed. In addition, there occurred a trouble of ceramic interlayer adhesion failure (delamination).

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method for producing a ceramic structure having at least either a surface recess or inner void therein formed by laminating and firing a plurality of ceramic green sheets, the method comprising:
    a step of disposing a resin sheet in a site to be a surface recess or inner void in ceramic green sheets to be laminated;
    a step of laminating the plurality of ceramic green sheets each with the resin sheet disposed therein; and
    a step of removing the resin sheets by thermal decomposition in firing the resulting ceramic green sheet laminate, wherein a relation of $T_a < T_b \leq T_c$ is satisfied wherein $T_a$ (° C.) indicates an 80% weight reduction temperature of an uppermost resin sheet, $T_b$ (° C.) indicates an 80% weight reduction temperature of a lowermost resin sheet, and $T_c$ (° C.) indicates a 20% weight reduction temperature of a resin binder which is contained in the ceramic green sheets in which the resin sheets are disposed.

2. The method for producing a ceramic structure of claim 1, wherein the step of removing the resin sheet by thermal decomposition in firing the ceramic green sheet laminate includes a first binder removal step of removing the uppermost resin sheet by thermal decomposition by keeping the temperature $T_a$° C. for a predetermined period of time and a second binder removal step of removing the lowermost resin sheet by thermal decomposition by keeping the temperature $T_b$° C. for a predetermined period of time.

3. The method for producing a ceramic structure of claim 2, wherein the step of removing the resin sheet by thermal decomposition in firing the ceramic green sheet laminate includes a third binder removal step of keeping the green sheet laminate at a temperature higher than $T_c$ (° C.) for a predetermined period of time.

4. A method for producing a ceramic structure having an inner void therein formed by laminating and firing a plurality of ceramic green sheets, comprising:
    a step of disposing a resin sheet in a site to be an inner void in the ceramic green sheet; and
    a step of laminating the plurality of ceramic green sheets to form a laminate of the ceramic green sheets which laminate has a recess filled with resin sheets,
    wherein a relation of $T_a < T_b \leq T_c$ is satisfied wherein $T_a$ (° C.) indicates an 80% weight reduction temperature of an uppermost resin sheet, $T_b$ (° C.) indicates an 80% weight reduction temperature of a lowermost resin sheet, and $T_c$ (° C.) indicates a 20% weight reduction temperature of a resin binder which is contained in the ceramic green sheets in which the resin sheets are disposed,
    the method further comprising:
    a first binder removal step of removing the uppermost resin sheet by thermal decomposition by keeping the temperature $T_a$° C. for a predetermined period of time followed by cooling the resulting green sheet to room temperature;
    a step of further laminating another such ceramic green sheet on the laminate so as to cover the recess filled with the resin sheet to thereby form a laminate having an inner void thereinside; and
    a second binder removal step of removing the lowermost resin sheet by thermal decomposition by keeping the temperature $T_b$° C. for a predetermined period of time.

5. The method for producing a ceramic structure of claim 4, further comprising:
    a third binder removal step of keeping the green sheet laminate at a temperature higher than $T_c$ (° C.) for a predetermined period of time.

* * * * *